(12) United States Patent
Shin

(10) Patent No.: US 10,998,056 B1
(45) Date of Patent: May 4, 2021

(54) MEMORY SYSTEM AND OPERATING METHOD THEREOF

(71) Applicant: SK hynix Inc., Gyeonggi-do (KR)

(72) Inventor: Beom Ju Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/825,796

(22) Filed: Mar. 20, 2020

(30) Foreign Application Priority Data

Nov. 19, 2019 (KR) .................. 10-2019-0149048

(51) Int. Cl.
| | | |
|---|---|---|
| *G11C 16/26* | (2006.01) | |
| *G11C 7/10* | (2006.01) | |
| *G11C 16/12* | (2006.01) | |
| *G11C 16/14* | (2006.01) | |
| *G11C 7/20* | (2006.01) | |

(52) U.S. Cl.
CPC ............ *G11C 16/26* (2013.01); *G11C 7/1063* (2013.01); *G11C 16/12* (2013.01); *G11C 16/14* (2013.01); *G11C 7/20* (2013.01)

(58) Field of Classification Search
None
See application file for complete search history.

(56) References Cited

U.S. PATENT DOCUMENTS

| | | | |
|---|---|---|---|
| 2017/0194053 A1* | 7/2017 | Micheloni | G11C 5/005 |
| 2018/0075917 A1* | 3/2018 | Utsunomiya | G06F 11/1451 |
| 2019/0080773 A1* | 3/2019 | Kondo | G06F 13/1689 |
| 2019/0392910 A1* | 12/2019 | Lee | G11C 16/14 |

FOREIGN PATENT DOCUMENTS

| | | |
|---|---|---|
| KR | 10-2002-0047199 | 6/2002 |
| KR | 10-2015-0080819 | 7/2015 |

\* cited by examiner

*Primary Examiner* — Tan T. Nguyen
(74) *Attorney, Agent, or Firm* — IP & T Group LLP

(57) ABSTRACT

There are provided a memory system and an operating method thereof. The memory system includes a semiconductor memory configured to perform a memory operation and perform a suspend operation of suspending a currently performed memory operation and a controller configured to control the memory operation. The controller controls the semiconductor memory to perform the suspend operation in a suspension-allowed period by determining a detailed operation period of the currently performed memory operation.

20 Claims, 13 Drawing Sheets

MEMORY SYSTEM AND OPERATING METHOD THEREOF

CROSS-REFERENCE TO RELATED APPLICATION

The present application claims priority under 35 U.S.C. § 119(a) to Korean patent application number 10-2019-0149048, filed on Nov. 19, 2019, which is incorporated herein by reference in its entirety.

BACKGROUND

Field of Invention

The present disclosure generally relates to an electronic device, and more particularly, to a memory system and an operating method thereof.

Description of Related Art

The paradigm on recent computer environment has turned into a ubiquitous computing environment in which computing systems can be used virtually anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device may include a Universal Serial Bus (USB) memory device, memory cards having various interfaces, a Solid State Drive (SSD), and the like.

The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied.

Examples of the volatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

Embodiments provide a memory system capable of avoiding a suspend operation in a period in which the reliability of a semiconductor memory is degraded, and an operating method of the memory system.

In accordance with an aspect of the present disclosure, there is provided a memory system including: a semiconductor memory configured to perform a memory operation and perform a suspend operation of suspending a currently performed memory operation; and a controller configured to control the memory operation, wherein the controller controls the semiconductor memory to perform the suspend operation in a suspension-allowed period by determining a detailed operation period of the currently performed memory operation.

In accordance with another aspect of the present disclosure, there is provided a memory system including: a memory device including a plurality of semiconductor memories; and a controller configured to control a selected semiconductor memory of the plurality of semiconductor memories to perform a suspend operation of suspending a currently performed memory operation of the selected semiconductor memory and a read operation when a host command corresponding to the read operation is received from a host, wherein the controller determines a detailed period of the currently performed memory operation, and controls the selected semiconductor memory to perform the suspend operation when the detailed period corresponds to a suspension-allowed period.

In accordance with still another aspect of the present disclosure, there is provided a method for operating a memory system, the method including: generating a status read command to determine a current state of a semiconductor memory in response to a request from a host; reading status data of the semiconductor memory in response to the status read command and outputting the status data to a controller; determining a detailed period of a currently performed memory operation of the semiconductor memory based on a ready/busy signal and the status data of the semiconductor memory; outputting a suspend command such that the semiconductor memory suspends the currently performed memory operation when the detailed period is a suspension-allowed period; and suspending the currently performed memory operation in response to the suspend command.

In accordance with still another aspect of the present disclosure, there is provided an operating method for a controller for controlling a memory device, the method including: perform a second memory operation while suspending a first memory operation which is currently being performed, during a suspension-allowed period of the first memory operation; and resume the suspended first memory operation upon completion of the second memory operation.

In accordance with still another aspect of the present disclosure, there is provided an operating method of a memory device, the method including: performing a second memory operation while suspending a first memory operation, which is currently being performed, during a suspension-allowed period of the first memory operation; and resuming the suspended first memory operation upon completion of the second memory operation.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Figure 1:
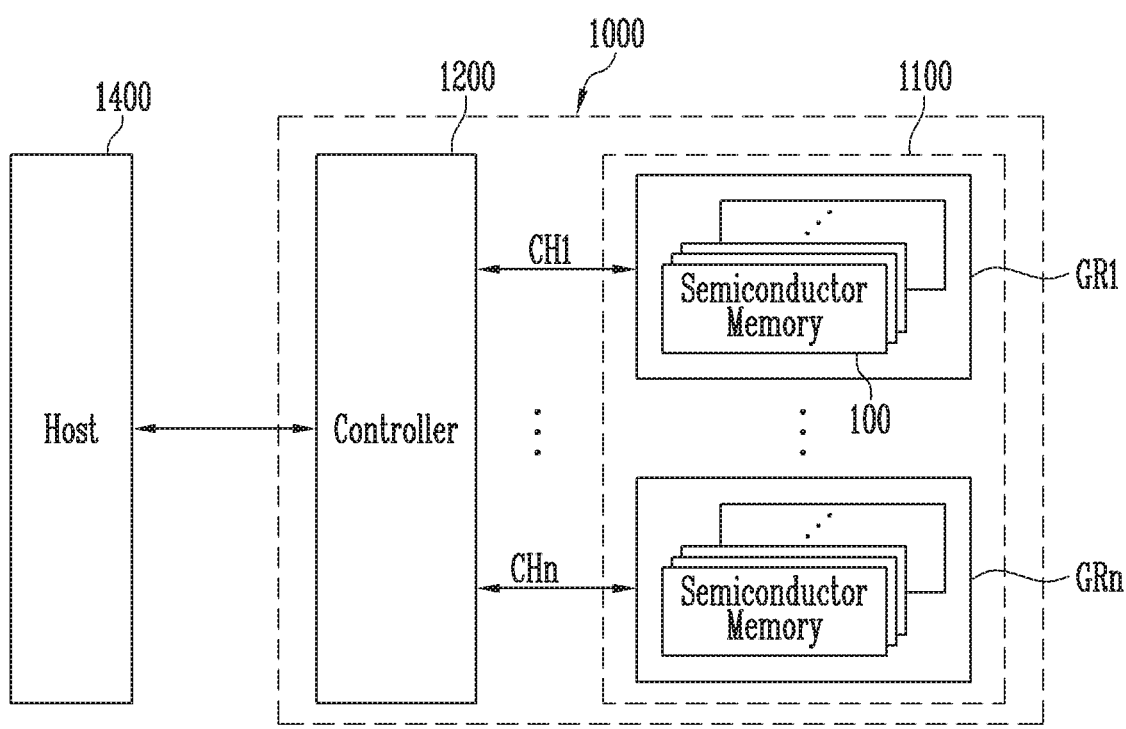
FIG. 1 is a block diagram illustrating a memory system in accordance with an embodiment of the present disclosure.

FIG. 1 is a block diagram illustrating a memory system in accordance with an embodiment of the present disclosure.

Referring to FIG. 1, the memory system 1000 includes a memory device 1100 and a controller 1200. The memory device 1100 includes a plurality of semiconductor memories 100. The plurality of semiconductor memories 100 may be divided into a plurality of groups GR1 to GRn.

In FIG. 1, illustrates that the plurality of groups GR1 to GRn communicate with the controller 1200 respectively through first to nth channels CH1 to CHn. Each semiconductor memory 100 will be described later with reference to FIG. 4.

Each of the plurality of groups GR1 to GRn communicates with the controller 1200 through one common channel. The controller 1200 controls the plurality of semiconductor memories 100 of the memory device 1100 through the plurality of channels CH1 to CHn.

The controller 1200 is coupled between a host 1400 and the memory device 1100. The controller 1200 accesses the memory device 1100 in response to a request from the host 1400. For example, the controller 1200 controls read, write, erase, and background operations of the memory device 1100 in response to a request received from the host 1400. The controller 1200 provides an interface between the memory device 1100 and the host 1400. The controller 1200 drives firmware for controlling the memory device 1100. Also, when a read command is received from the host 1400, the controller 1200 may perform a suspend control operation of controlling a selected semiconductor memory 100 included in the memory device 1100 to suspend a currently ongoing memory operation of the selected memory 100 and to perform a read operation. In the suspend control operation, the controller 1200 may control a semiconductor memory 100 selected to perform a status read operation to determine a current state of the selected semiconductor memory 100, determine the currently ongoing memory operation, based on status data read as a result of the status read operation, and control the selected semiconductor memory 100 to perform a suspend operation of the operation being currently performed during an operation period corresponding to a suspension-allowed period. For example, a suspension-allowed period during a program operation may be the other operation period except a period in which a program pulse is applied, and a suspension-allowed period during an erase operation may be the other operation period except a period in which a Gate Induced Drain Leakage (GIDL) current is generated.

The host 1400 controls the memory system 1000. The host 1400 includes portable electronic devices such as a computer, a PDA, a PMP, an MP3 player, a camera, a camcorder, and a mobile phone. The host 1400 may request a write operation, a read operation, an erase operation, etc. of the memory system 1000 through a command.

The controller 1200 and the memory device 1100 may be integrated into one semiconductor device. In an exemplary embodiment, the controller 1200 and the memory device 1100 may be integrated into one semiconductor device, to constitute a memory card. For example, the controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

The controller 1200 and the memory device 1100 may be integrated into one semiconductor device to constitute a semiconductor drive (Solid State Drive (SSD)). The semiconductor drive SSD includes a storage device configured to store data in a semiconductor memory. When the memory system 1000 is used as the semiconductor drive (SDD), the operating speed of the host 1400 coupled to the memory system 1000 is remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving Information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
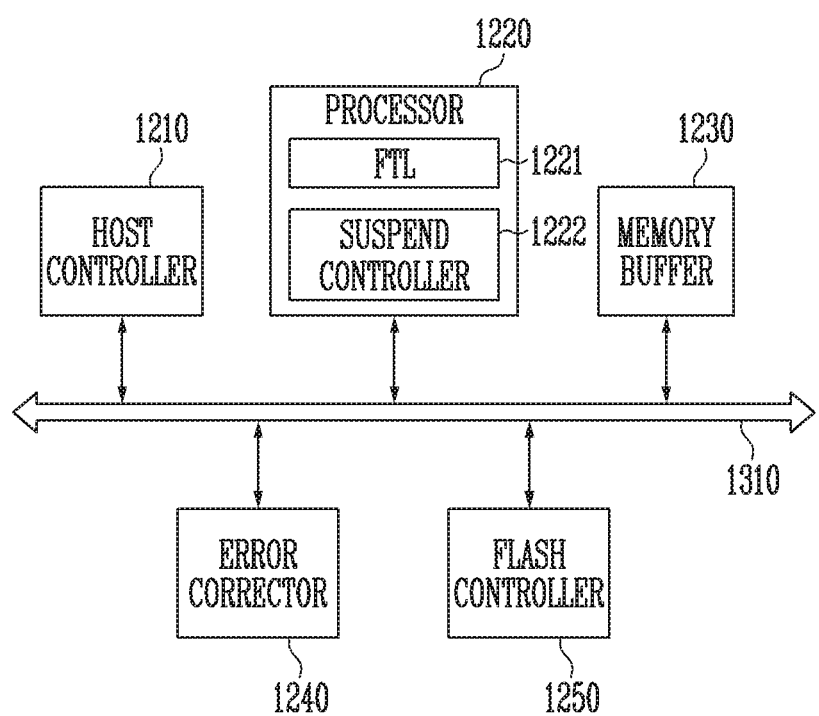
FIG. 2 is a block diagram illustrating a configuration of a controller shown in FIG. 1.

FIG. 2 is a block diagram illustrating a configuration of the controller shown in FIG. 1.

Referring to FIG. 2, the controller 1200 may include a host controller 1210, a processor 1220, a memory buffer 1230, an error corrector 1240, a flash controller 1250, and a bus 1310.

The bus 1310 may provide a channel between components of the controller 1200.

The host controller 1210 may control data transmission between the host 1400 shown in FIG. 1 and the memory buffer 1230. In an example, the host controller 1210 may control an operation of buffering data input from the host 1400 to the memory buffer 1230. In another example, the host controller 1210 may control an operation of outputting, to the host 1400, the data buffered to the memory buffer 1230. The host controller 1210 may include a host interface.

The processor 1220 may control the overall operations of the controller 1200, and perform a logical operation. The processor 1220 may communicate with the host 1400 shown in FIG. 1 through the host controller 1210, and communicate with the memory device 1100 shown in FIG. 1 through the flash controller 1250. For example, when a plurality of host commands (a write command, a read command, an erase command, and the like) are received from the host 1400, the processor 1220 may generate a command queue by queuing the plurality of host commands according to an order of priority.

Also, the processor 1220 may control the memory buffer 1230. The processor 1220 may control an operation of the memory system 1000 by using the memory buffer 1230 as a working memory, a cache memory, or a buffer memory.

The processor 1220 may include a Flash Translation Layer (hereinafter, referred to as 'FTL') 1221 and a suspend controller 1222.

The FTL 1221 drives firmware stored in the memory buffer 1230. Also, the FTL 1221 may map a corresponding physical address to a logical address input from the host 1400 shown in FIG. 1 in a data write operation. Also, the FTL 1221 checks the physical address mapped to the logical address input from the host 1400 in a data read operation.

When a read request is received from the host 1400, the suspend controller 1222 may control the memory device (1100 shown in FIG. 1) to perform the read operation more preferentially than other requests which are already queued and still pending. For example, the suspend controller 1222 may control, by determining a current status of a selected semiconductor memory included in the memory device (1100 shown in FIG. 1), the selected semiconductor memory to immediately perform a read operation or to perform a suspend operation of suspending a currently ongoing memory operation and then perform the read operation. The suspend controller 1222 may control the selected semiconductor memory to perform the suspend operation in a suspension-allowed period other than a suspension-prohibited period by determining a detailed operation period of the currently ongoing memory operation.

The memory buffer 1230 may be used as a working memory, cache memory or buffer memory of the processor 1220. The memory buffer 1230 may store codes and commands, which are executed by the processor 1220. The memory buffer 1230 may store data processed by the processor 1220. The memory buffer 1230 may include a Static RAM (SRAM) or a Dynamic RAM (DRAM). The memory buffer 1230 may store a command queue generated by the processor 1220.

The error corrector 1240 may perform error correction. The error corrector 1240 may perform Error Correction Code (ECC) encoding, based on data to be written to the memory device 1100 shown in FIG. 1 through the flash controller 1250. The ECC-encoded data may be transferred to the memory device 1100 through the flash controller 1250. The error corrector 1240 may perform ECC decoding on data received from the memory device 1100 through the flash controller 1250. In an example, the error corrector 1240 may be included in the flash controller 1250 as a component of the flash controller 1250.

The flash controller 1250 generates and outputs an internal command for controlling the memory device 1100 in response to a command queue generated by the processor 1220. The flash controller 1250 may control a program operation by transmitting data buffered to the memory buffer 1230 to the memory device 1100 in a data write operation. In another example, the flash controller 1250 may control an operation of buffering data read and output from the memory device 1100 to the memory buffer 1230 in response to the command queue in a read operation. The flash controller 1250 may include a flash interface.

Figure 3:
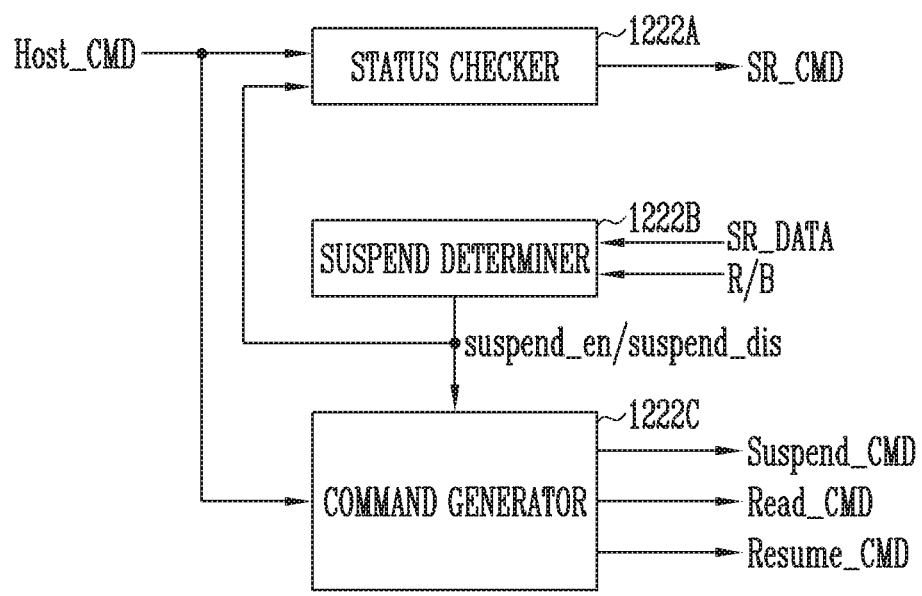
FIG. 3 is a block diagram illustrating a suspend controller shown in FIG. 2.

FIG. 3 is a block diagram illustrating the suspend controller shown in FIG. 2.

Referring to FIG. 3, the suspend controller 1222 may include a status checker 1222A, a suspend determiner 1222B, and a command generator 1222C.

The status checker 1222A generates and outputs a status read command SR_CMD for controlling a selected semiconductor memory among the plurality of semiconductor memories 100 included in the memory device (1100 shown in FIG. 1) to perform a status read operation of the selected semiconductor memory, in response to a host command Host_CMD corresponding to a read operation from the host (1400 shown in FIG. 1) and a suspend disable signal suspend_dis generated by the suspend determiner 1222B. The status read command SR_CMD output from the status checker 1222A may be transmitted to the selected semiconductor memory through the flash controller shown in FIG. 2.

The suspend determiner 1222B determines a current state of a selected semiconductor memory among the plurality of semiconductor memories 100 included in the memory device (1100 shown in FIG. 1), based on a ready/busy signal R/B and status read data SR_DATA, which are received from the selected semiconductor memory, and determines whether the selected semiconductor memory is allowed to perform a suspend operation based on the determination result.

For example, the suspend determiner 1222B may determine, based on the ready/busy signal R/B, whether the selected semiconductor memory is in a ready state in which the selected memory device is ready for an operation without currently performing program, read or erase operations or in a busy state in which the selected semiconductor memory is performing any one of the program, read and erase operations. For example, when the selected semiconductor memory is in the ready state, the suspend determiner 1222B determines that the selected semiconductor memory is allowed to perform the suspend operation, and generates and outputs a suspend enable signal suspend_en.

When the selected semiconductor memory is in the busy state, the suspend determiner 1222B determines, based on the status read data SR_DATA, whether the selected semiconductor memory is allowed to perform the suspend operation. For example, when it is determined that the selected semiconductor memory currently performs a read operation, based on the status read data SR_DATA, the suspend determiner 1222B determines that the selected semiconductor memory is not allowed to perform the suspend operation, and generates and outputs the suspend disable signal suspend_dis. For example, when it is determined, based on the status read data SR_DATA, that the selected semiconductor memory currently performs a program operation and performs an operation corresponding to the suspension-allowed period during the program operation, the suspend determiner 1222B determines that the selected semiconductor memory is allowed to perform the suspend operation, and generates and outputs the suspend enable signal suspend_en. For example, when it is determined, based on the status read data SR_DATA, that the selected semiconductor memory currently performs a program operation and performs an operation corresponding to the suspension-prohibited period during the program operation, the suspend determiner 1222B determines that the selected semiconductor memory is not allowed to perform the suspend operation, and generates and outputs the suspend disable signal suspend_dis. For example, when it is determined, based on the status read data SR_DATA, that the selected semiconductor memory currently performs an erase operation and performs an operation corresponding to the suspension-allowed period during the erase operation, the suspend determiner 1222B determines that the selected semiconductor memory 100 is allowed to perform the suspend operation, and generates and outputs the suspend enable signal suspend_en. For example, when it is determined, based on the status read data SR_DATA, that the selected semiconductor memory currently performs an erase operation and performs an operation corresponding to the suspension-prohibited period during the erase operation, the suspend determiner 1222B determines that the selected semiconductor memory 100 is not allowed to perform the suspend operation, and generates and outputs the suspend disable signal suspend_dis.

For example, the suspension-prohibited period during the program operation may be a period in which a program pulse is applied, and the suspension-allowed period during the program operation may be a period other than the suspension-prohibited period during the program operation. For example, the suspension-prohibited period during the erase operation may be a period in which a GIDL current is generated, and the suspension-allowed period during the erase operation may be a period other than the suspension-prohibited period during the erase operation.

The command generator 1222C generates and outputs a suspend command Suspend_CMD for suspending the currently ongoing memory operation of a selected semiconductor memory, in response to the suspend enable signal suspend_en generated by the suspend determiner 1222B. Also, the command generator 1222C generates and outputs a read command Read_CMD for controlling the selected semiconductor memory in a ready state or a suspend state to perform a read operation, in response to the host command Host_CMD. Also, the command generator 1222C generates and outputs a resume command Resume_CMD for controlling the semiconductor memory in the suspend state to resume the suspended operation when the read operation of the semiconductor memory in the suspend state is completed. When the selected semiconductor memory is in the ready state, the command generator 122C may skip an operation of generating the suspend command Suspend_CMD, and generate and output the read command Read_CMD, in response to the suspend enable signal suspend_en generated by the suspend determiner 1222B. The suspend command Suspend_CMD, the read command Read_CMD, and the resume command Resume_CMD may be transmitted to the selected semiconductor memory through the flash controller 1250 shown in FIG. 2.

Figure 4:
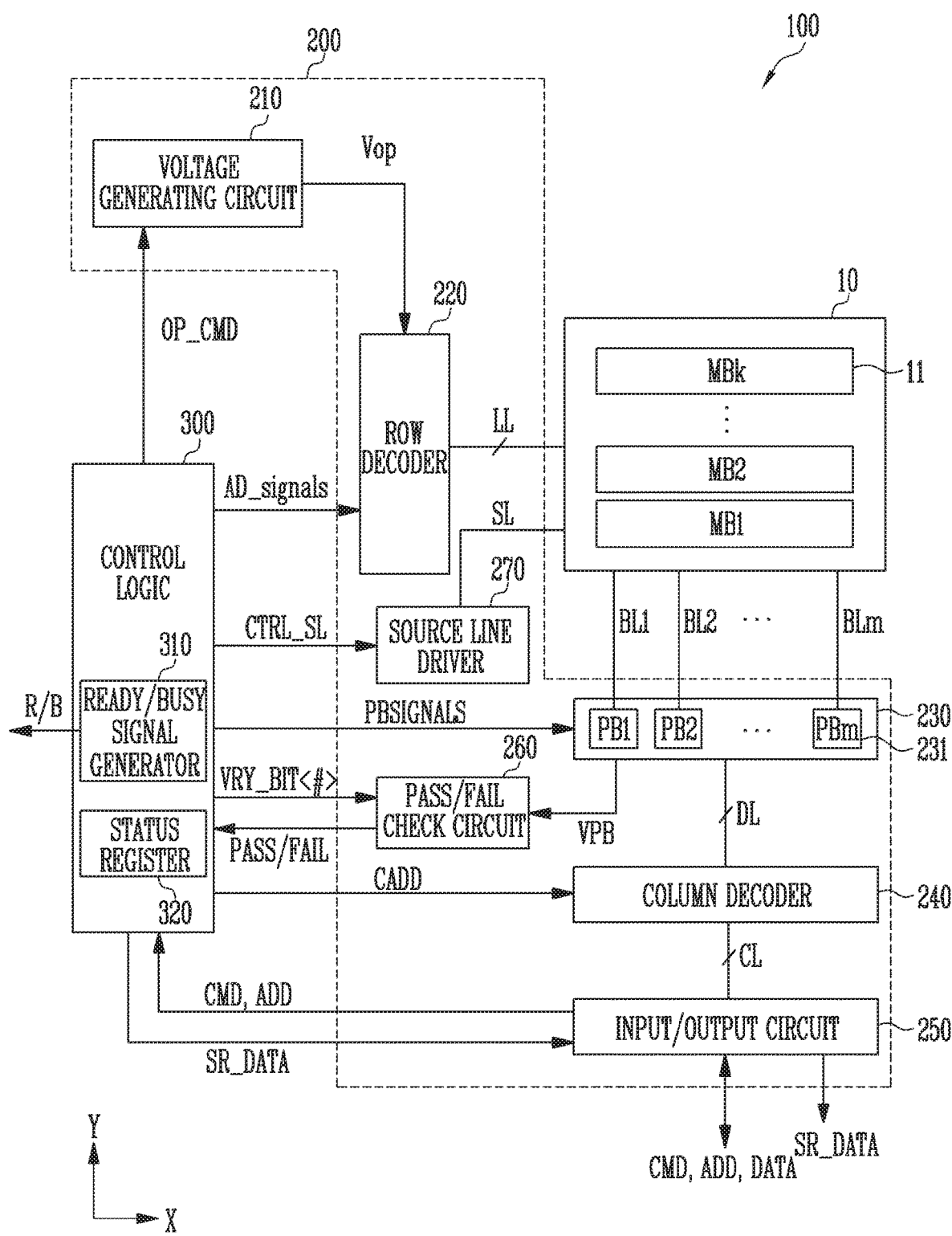
FIG. 4 is a diagram illustrating a semiconductor memory shown in FIG. 1.

FIG. 4 is a diagram illustrating the semiconductor memory 100 shown in FIG. 1.

Referring to FIG. 4, the semiconductor memory 100 may include a memory cell array 10 which stores data. The semiconductor memory 100 may include peripheral circuits 200 configured to perform a program operation for storing data in the memory cell array 10, a read operation for outputting the stored data, and an erase operation for erasing the stored data. The semiconductor memory 100 may include a control logic 300 which controls the peripheral circuits 200 under the control of the controller (1200 shown in FIG. 1).

The memory cell array 10 may include a plurality of memory blocks MB1 to MBk 11 (k is a positive integer). Local lines LL and bit lines BL1 to BLm (m is a positive integer) may be coupled to the memory blocks MB1 to MBk 11. For example, the local lines LL may include a first select line, a second select line, and a plurality of word lines arranged between the first and second select lines. Also, the local lines LL may include dummy lines arranged between the first select line and the word lines, and between the second select line and the word lines. The first select line may be a source select line, and the second select line may be a drain select line. For example, the local lines LL may include word lines, drain and source select lines, and source lines SL. For example, the local lines LL may further Include dummy lines. For example, the local lines LL may further include pipe lines. The local lines LL may be coupled to the memory blocks MB1 to MBk 11, respectively, and the bit lines BL1 to BLm may be commonly coupled to the memory blocks MB1 to MBk 11. The memory blocks MB1 to MBk 11 may be implemented in a two-dimensional or three-dimensional structure. For example, memory cells may be arranged in a direction parallel to a substrate in memory blocks 11 having a two-dimensional structure. For example, memory cells may be arranged in a direction vertical to a substrate in memory blocks 11 having a three-dimensional structure.

The peripheral circuits 200 may be configured to perform program, read, and erase operations of a selected memory block 11 under the control of the control logic 300. For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, a pass voltage, and a select transistor operation voltage under the control of the control logic 300.

The row decoder 220 may transfer the operating voltages Vop to local lines LL coupled to the selected memory block 11 in response to row decoder control signals AD_signals. For example, the row decoder 220 may selectively apply operation voltages (e.g., a program voltage, a verify voltage, a pass voltage, and the like) generated by the voltage generating circuit 210 to word lines among the local lines LL in response to the row decoder control signals AD_signals.

In a program voltage applying operation, the row decoder 220 applies a program voltage generated by the voltage generating circuit 210 to a selected word line among the local lines LL in response to the row decoder control signals AD_signals, and applies a pass voltage generated by the voltage generating circuit 210 to the other unselected word lines. Also, in a read operation, the row decoder 220 applies a read voltage generated by the voltage generating circuit 210 to a selected word line among the local lines LL in response to the row decoder control signals AD_signals, and applies a pass voltage generated by the voltage generating circuit 210 to the other unselected word lines.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data to be programmed in a program operation, or sense voltages or currents of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer an internal command CMD and an address ADD, which are received from the controller (1200 shown in FIG. 1), to the control logic 300, or exchange data DATA with the column decoder 240. The input/output circuit 250 may output, to the controller 1200, status read data SR_DATA received from a status register 320 in a status read operation.

In a read operation or verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 10 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuits 200 by outputting the operation signal OP_CMD, the row decoder control signals AD_signals, the page buffer control signals PBSIGNALS, and the allow bit VRY_BIT<#> in response to the internal command CMD and the address ADD. Also, the control logic 300 may determine whether the verify operation has passed or failed in response to the pass or fail signal PASS or FAIL. When a suspend command is received from the controller 1200, the control logic 300 may suspend the currently ongoing memory operation. When a read command is received from the controller 1200, the control logic 300 may perform a read operation corresponding to the read command and transmit read data to the controller 1200. When a resume command is received from the controller 1200, the control logic 300 may resume the operation suspended by the suspend command.

The control logic 300 may include a ready/busy signal generator 310 and the status register 320.

The ready/busy signal generator 310 generates and outputs a ready/busy signal R/B representing whether the semiconductor memory 100 is in a ready state in which the semiconductor memory 100 is ready for an operation without performing a memory operation such as a program operation, a read operation, an erase operation, or the like of the semiconductor memory 100 or in a busy state in which the semiconductor memory 100 is performing the memory operation.

The status register 320 stores detailed information of a currently ongoing memory operation. For example, the status register 320 may store detailed information of a memory operation, which includes the currently ongoing memory operation and information on a detailed period of the operation being currently performed. When a status read command is received from the controller (1200 shown in FIG. 1), the status register 320 may output the stored detailed information of the memory operation as status read data SR_DATA.

Figure 5:
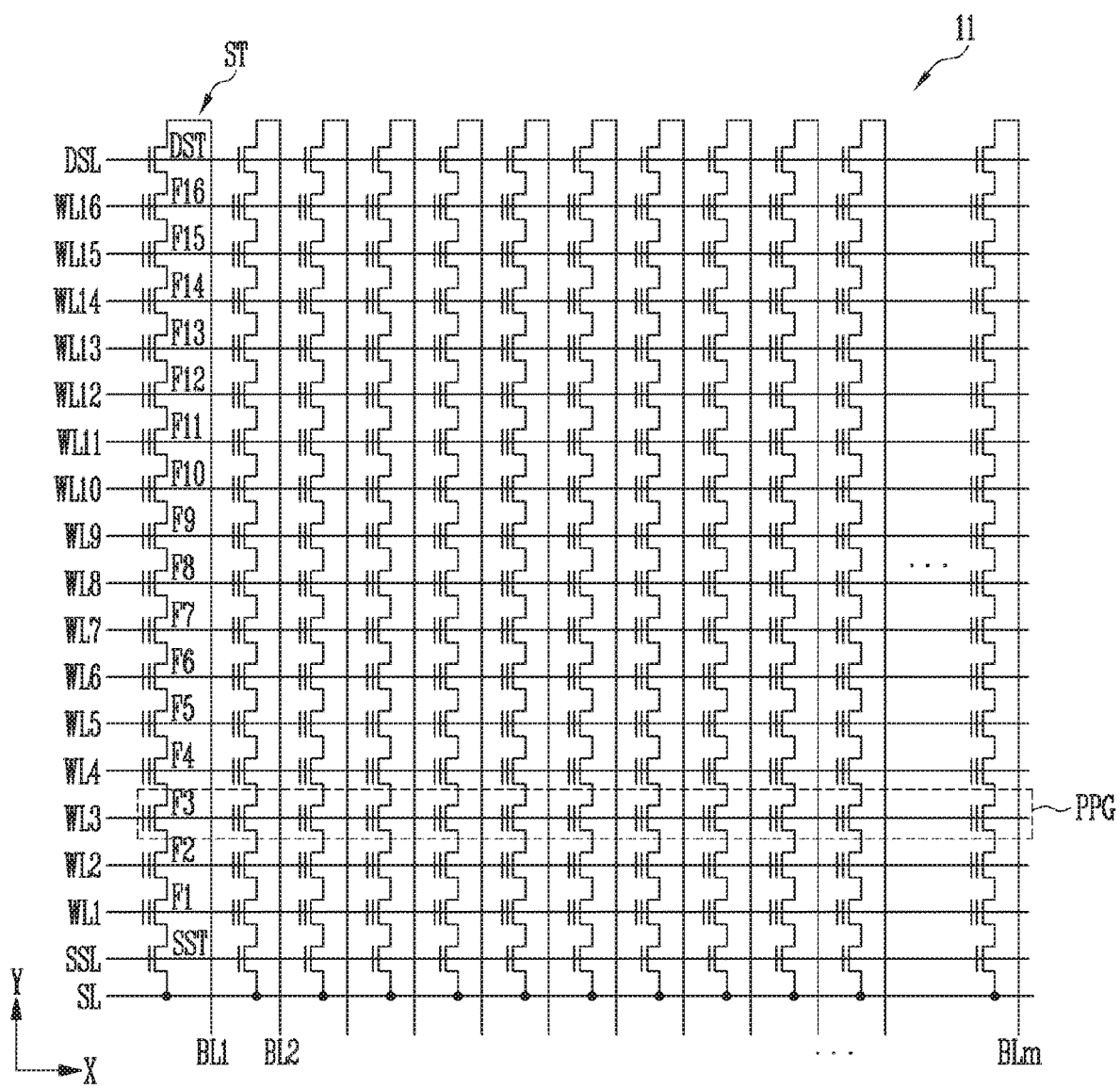
FIG. 5 is a diagram illustrating a memory block shown in FIG. 4.

FIG. 5 is a diagram illustrating the memory block shown in FIG. 4.

Referring to FIG. 5, in the memory block 11, a plurality of word lines arranged in parallel to one another may be coupled between a first select line and a second select line. The first select line may be a source select line SSL, and the second select line may be a drain select line DSL. More specifically, the memory block 11 may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series between the source line SL and the first bit line BL1. At least one source select transistor SST and at least one drain select transistor DST may be included in one string ST, and a number of memory cells greater than the number of the memory cells F1 to F16 shown in the drawing may be included in the one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, and gates of the memory cells F1 to F16 included in different strings ST may be coupled to the plurality of word lines WL1 to WL16. A group of memory cells coupled to the same word line among the memory cells included in different strings ST may be referred to as a physical page PPG. Therefore, a number of physical pages PPG which corresponds to the number of word lines WL1 to WL16 may be included in the memory block 11.

When one memory cell stores data of one bit, the memory cell is generally referred to as a single level cell (SLC). Therefore, one physical page PPG may store one logical page (LPG) data. One LPG data may include data bits corresponding to a number of cells included in one physical page PPG. In addition, when one memory cell stores data of two or more bits, the memory cell is generally referred to as a multi-level cell (MLC). Therefore, one physical page PPG may store two or more LPG data.

Figure 6:
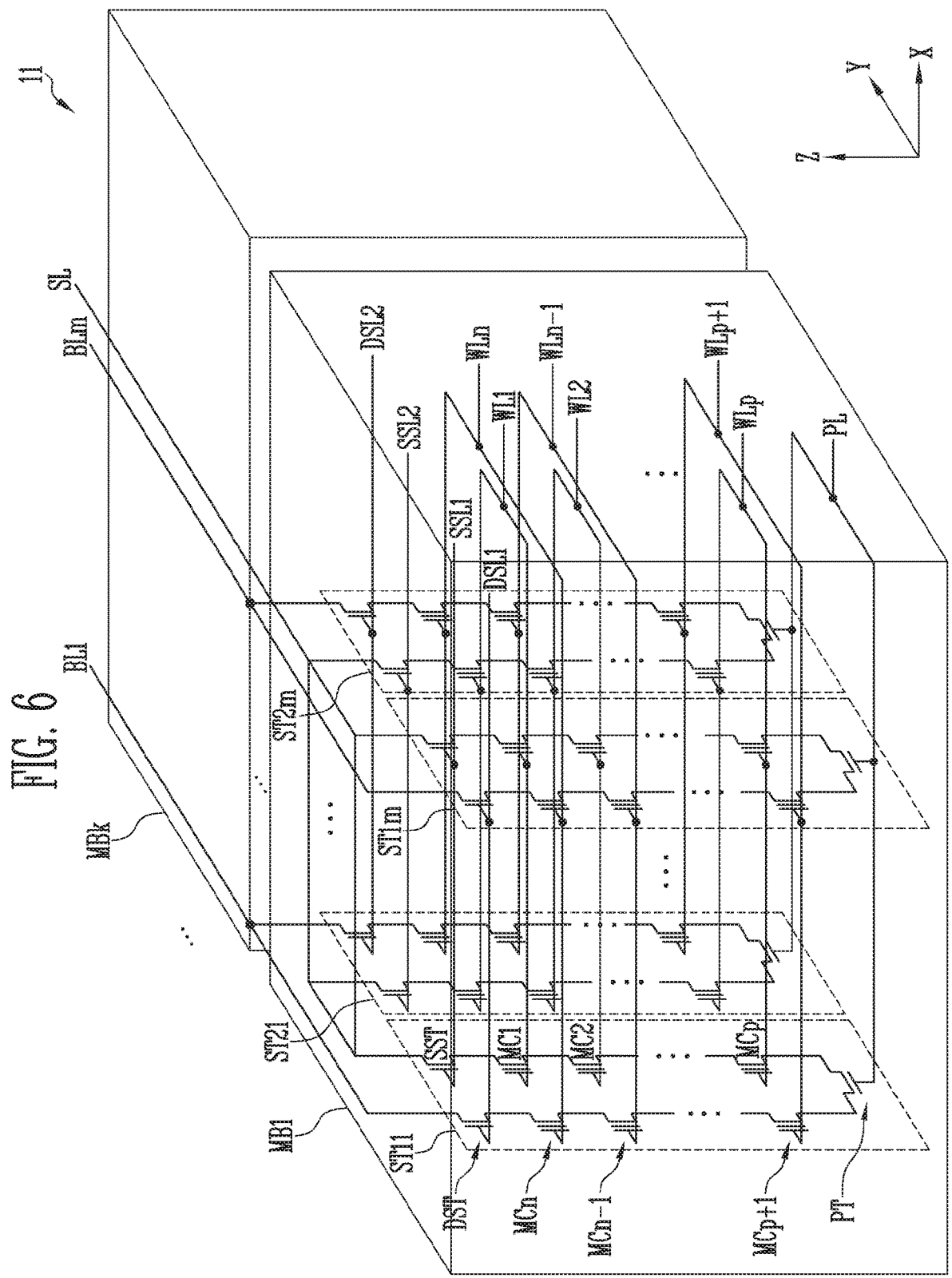
FIG. 6 is a diagram illustrating an embodiment of a three-dimensionally configured memory block.

FIG. 6 is a diagram illustrating an embodiment of a three-dimensionally configured memory block.

Referring to FIG. 6, the memory cell array 10 may include a plurality of memory blocks MB1 to MBk 11. The memory block 11 may include a plurality of strings ST11 to ST1$m$ and ST21 to ST2$m$. In an embodiment, each of the plurality of strings ST11 to ST1$m$ and ST21 to ST2$m$ may be formed in a 'U' shape. In the memory block 11, m strings may be arranged in a row direction (X direction). Although a case where two strings are arranged in a column direction (Y direction) is illustrated in FIG. 6, this is for convenience of description, and three or more strings may be arranged in the column direction (Y direction).

Each of the plurality of strings ST11 to ST1$m$ and ST21 to ST2$m$ may include at least one source select transistor SST, first to nth memory cells MC1 to MCn, a pipe transistor PT, and at least one drain select transistor DST.

The source and drain select transistors SST and DST, and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged on the same row may be coupled to a source select line extending in the row direction, and source select transistors of strings arranged in different rows may be coupled to different source select lines. In FIG. 6, source select transistors of strings ST11 to ST1$m$ of a first row may be coupled to a first source select line SSL1. Source select transistors of strings ST21 to ST2$m$ of a second row may be coupled to a second source select line SSL2.

In another embodiment, the source select transistors of the strings ST11 to ST1$m$ and ST21 to ST2$m$ may be commonly coupled to one source select line.

The first to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When the dummy memory cell is provided, a voltage or current of a corresponding string can be stably controlled. A gate of the pipe transistor PT of each string may be coupled to the pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1$m$ on the first row may be coupled to a first drain select line DSL1. Drain select transistors of the strings ST21 to ST2$m$ on the second row may be coupled to a second drain select line DSL2.

Strings arranged in the column direction may be coupled to bit lines extending in the column direction. In FIG. 6, strings ST11 and ST21 of a first column may be coupled to a first bit line BL1. Strings ST1$m$ and ST2$m$ of an mth column may be coupled to an mth bit line BLm.

Memory cells coupled to the same word line among the strings arranged in the row direction may constitute one page. For example, memory cells coupled to the first word line WL1 among the strings ST11 to ST1$m$ of the first row may constitute one page. Memory cells coupled to the first word line WL1 among the strings ST21 to ST2$m$ of the second row may constitute another page. When any one of the drain select lines DSL1 and DSL2 is selected, strings arranged in one row direction may be selected. When any one of the word lines WL1 to WLn is selected, one page among the selected strings may be selected.

Figure 7:
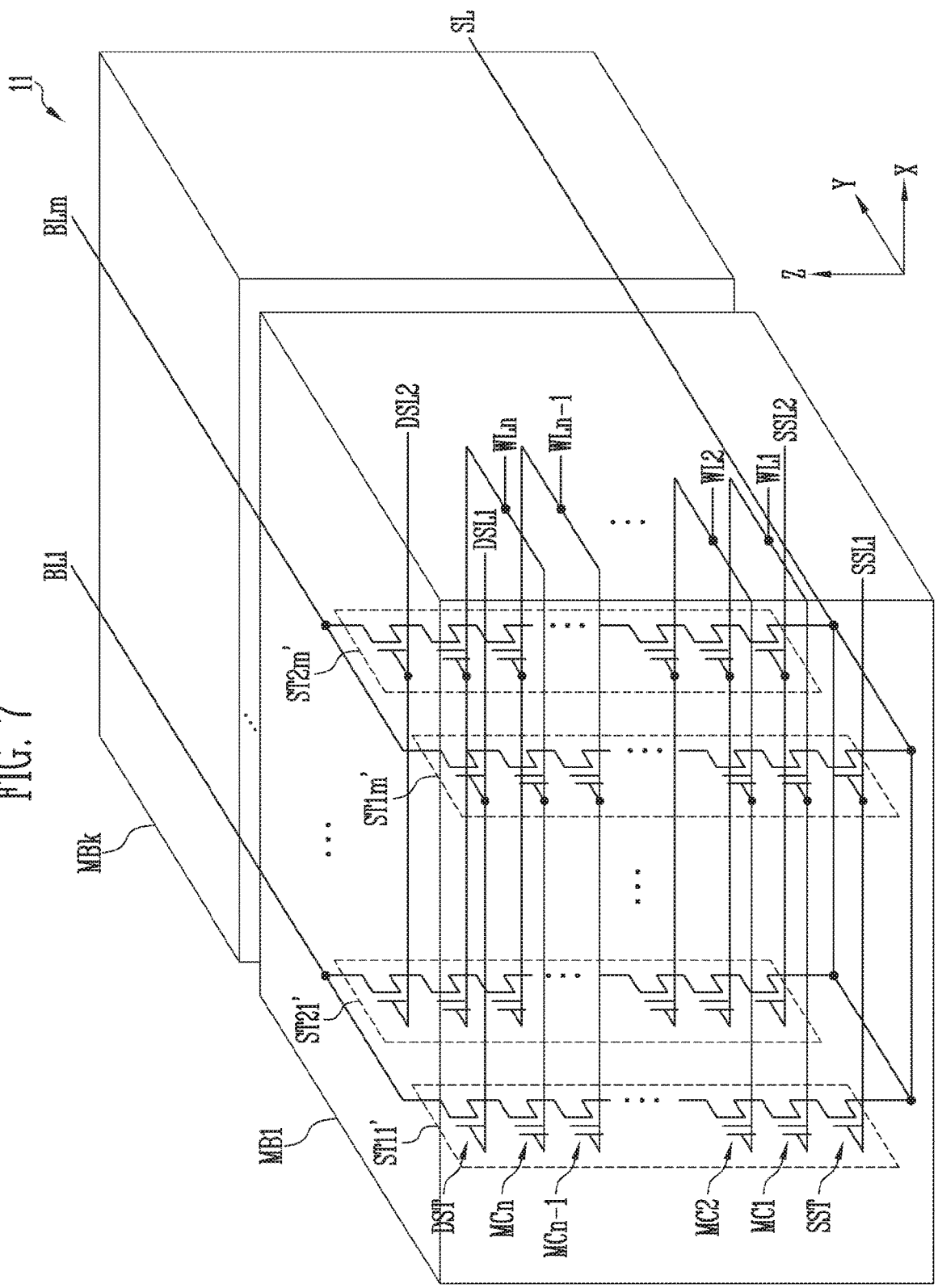
FIG. 7 is a diagram illustrating another embodiment of the three-dimensionally configured memory block.

FIG. 7 is a diagram illustrating another embodiment of the three-dimensionally configured memory block.

Referring to FIG. 7, the memory cell array 10 may include a plurality of memory blocks MB1 to MBk 11. The memory block 11 may include a plurality of strings ST11' to ST1$m$' and ST21' to ST2$m$'. Each of the plurality of strings ST11' to ST1$m$' and ST21' to ST2$m$' may extend along a vertical direction (Z direction). In the memory block 11, m strings may be arranged in a row direction (X direction). Although a case where two strings are arranged in a column direction (Y direction) is illustrated in FIG. 7, this is for convenience of description, and three or more strings may be arranged in the column direction (Y direction).

Each of the plurality of strings ST11' to ST1$m$' and ST21' to ST2$m$' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1$m$' arranged on a first row may be coupled to a first source select line SSL1. Source select transistors of strings ST21' to ST2$m$' arranged on a second row may be coupled to a second source select line SSL2. In another embodiment, the source select transistors of the strings ST11' to ST1m' and ST21' to ST2m' may be commonly coupled to one source select line.

The first to nth memory cells MC1 to MCn of each string may be coupled in series between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When the dummy memory cell is provided, a voltage or current of a corresponding string can be stably controlled. Accordingly, the reliability of data stored in the memory block 11 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

Figure 8:
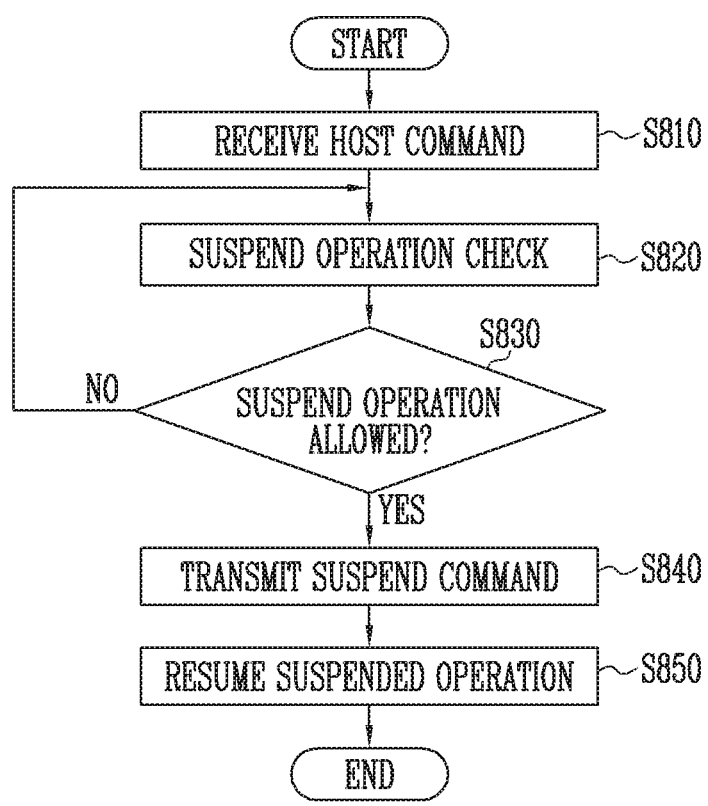
FIG. 8 is a flowchart illustrating an operating method of the memory system in accordance with an embodiment of the present disclosure.

FIG. 8 is a flowchart illustrating an operating method of the memory system in accordance with an embodiment of the present disclosure.

The operating method of the memory system in accordance with the embodiment of the present disclosure will be described as follows with reference to FIGS. 1 to 8.

When a host command Host_CMD for a specific operation subject to a suspend operation is received from the host 1400 (S810), the suspend controller 1222 checks whether a selected semiconductor memory 100 among a plurality of semiconductor memories 100 included in the memory device 1100 is allowed to perform the suspend operation (S820).

In the step S820 of checking whether the selected semiconductor memory 100 is allowed to perform the suspend operation, the controller 1200 receives a ready/busy signal R/B and status read data SR_DATA from the selected semiconductor memory 100, and checks whether the selected semiconductor memory 100 is allowed to perform the suspend operation based on the ready/busy signal R/B and the status read data SR_DATA. For example, the controller 1200 determines that the selected semiconductor memory 100 is allowed to perform the suspend operation when the selected semiconductor memory 100 is in a ready state or when the selected semiconductor memory 100 performs an operation corresponding to a suspension-allowed period while being in a busy state. Also, the controller 1200 determines that the selected semiconductor memory 100 is not allowed to perform the suspend operation when the selected semiconductor memory 100 performs an operation corresponding to a suspension-prohibited period.

When it is determined in the step S820 of checking whether the selected semiconductor memory 100 is allowed to perform the suspend operation that the selected semiconductor memory 100 is not allowed to perform the suspend operation as a result obtained by determining whether the selected semiconductor memory 100 is allowed to perform the suspend operation (S830) (No), the suspend determiner 1222B generates and outputs a suspend disable signal suspend_dis, and the status checker 1222A generates and outputs a status read command SR_CMD for controlling the selected semiconductor memory to perform a status read operation. The selected semiconductor memory outputs new status read data SR_DATA in response to the status read command SR_CMD, and the suspend determiner 1222B repeats the above-described processes from the step S820 by using the new status read data SR_DATA.

When it is determined that the selected semiconductor memory 100 is allowed to perform the suspend operation, as a result obtained by determining whether the selected semiconductor memory 100 is allowed to perform the suspend operation (S830) (Yes), the suspend determiner 1222B generates and outputs a suspend enable signal suspend_en. The command generator 1222C generates and outputs a suspend command Suspend_CMD for suspending a currently ongoing memory operation of the selected semiconductor memory, in response to the suspend enable signal suspend_en generated by the suspend determiner 1222B. The suspend command Suspend_CMD may be transmitted to the selected semiconductor memory through the flash controller 1250 shown in FIG. 2 (S840). The selected semiconductor memory suspends the currently ongoing memory operation, in response to the suspend command Suspend_CMD.

Subsequently, the selected semiconductor memory may receive a command for the specific operation from the controller 1200 and perform the specific operation in response to the command. When the specific operation is completed, the selected semiconductor memory may receive a resume command from the controller 1200 and resume the operation that was being performed before the operation was suspended by the suspend command Suspend_CMD (S850).

Figure 9:
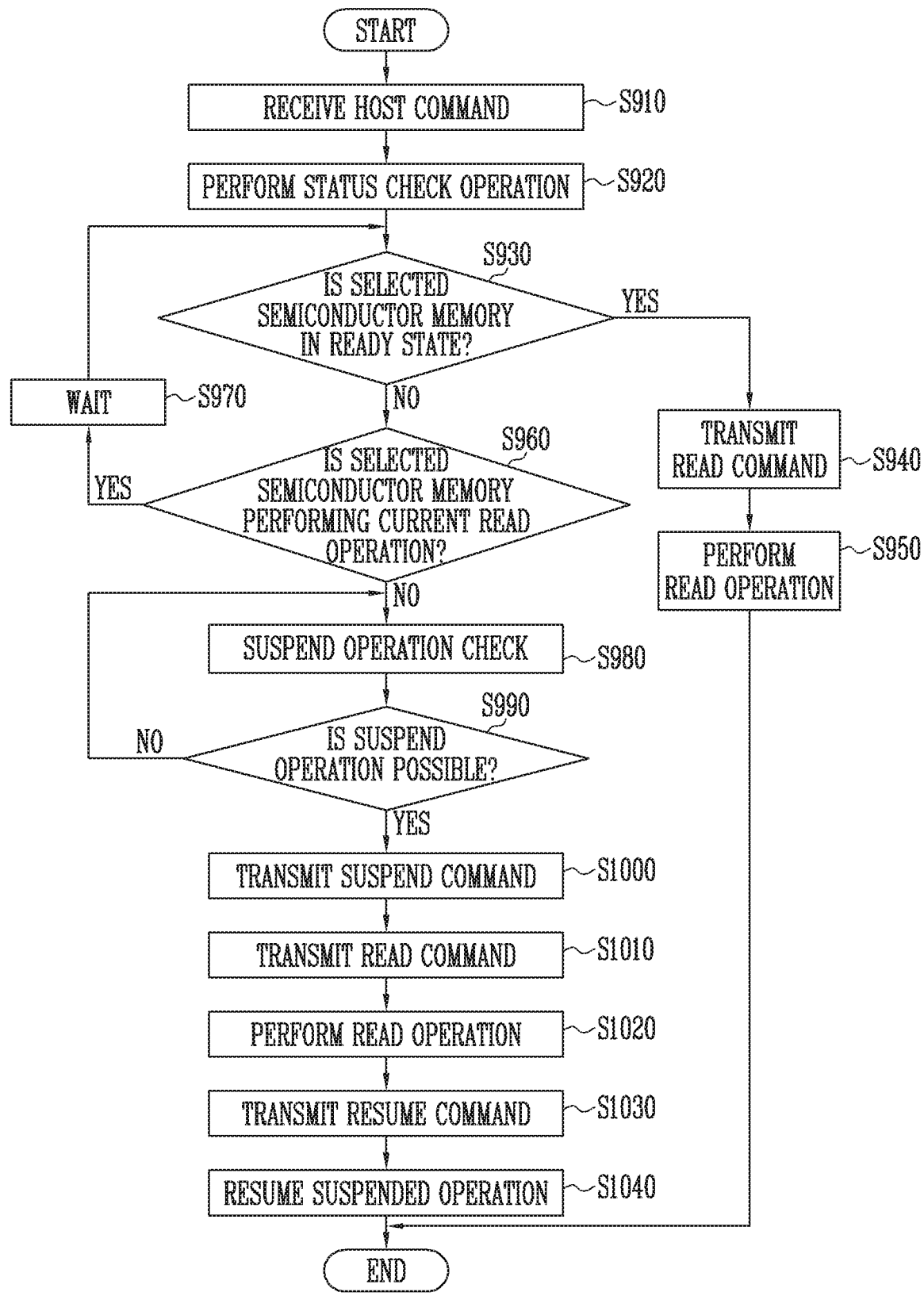
FIG. 9 is a flowchart illustrating an operating method of the memory system in accordance with another embodiment of the present disclosure.

FIG. 9 is a flowchart illustrating an operating method of the memory system in accordance with another embodiment of the present disclosure.

The operating method of the memory system in accordance with the embodiment of the present disclosure will be described as follows with reference to FIGS. 1 to 7 and 9.

When a host command Host_CMD corresponding to a read operation is received from the host 1400 (S910), the suspend controller 1220 may generate and output a status read command SR_CMD for controlling a selected semiconductor memory 100 among a plurality of semiconductor memories 100 included in the memory device 1100 to perform a status read operation of the selected semiconductor memory 100. The status read command SR_CMD generated by the suspend controller 1222 may be transmitted to the selected semiconductor memory through the flash controller 1250.

The suspend controller 1222 determines a current state of the selected semiconductor memory, based on status read data SR_DATA and a ready/busy signal R/B, which are received from the selected semiconductor memory, and performs a status check operation of determining whether the selected semiconductor memory is allowed to perform a suspend operation, based on the determination result (S920).

First, the suspend determiner 1222B determines whether the selected semiconductor memory is in a ready state, based on the ready/busy signal R/B received from the selected semiconductor memory (S930).

As a result of the step S930 of determining whether the selected semiconductor memory is in the ready state, when the selected semiconductor memory is in the ready state (Yes), the command generator 1222C generates and outputs a read command Read_CMD for controlling the selected semiconductor memory to perform a read operation, in response to a suspend enable signal suspend_en generated by the suspend determiner 1222B, and the flash controller 1250 transmits the read command Read_CMD generated by the command generator 1222C to the selected semiconductor memory (S940).

The selected semiconductor memory reads data DATA stored in a corresponding area in response to the received read command Read_CMD, and performs the read operation of transmitting the read data DATA to the controller 1200 (S950). The data DATA transmitted to the controller 1200 may be temporarily stored in the memory buffer 1230 and then be transmitted to the host 1400 through the host controller 1210.

As a result of the step S930 of determining whether the selected semiconductor memory is in the ready state, when the selected semiconductor memory is in a busy state (No), the suspend determiner 1222B determines whether the selected semiconductor memory is currently performing a read operation, based on the status read data SR_DATA received from the selected semiconductor memory (S960). The read operation of step S960 may not be the specific operation subject to the suspend operation rather a memory operation, such as a program operation and an erase operation, may be subject to the suspend operation. Therefore, during the read operation of step S960, the suspend operation may not be allowed.

As a result of the step S960 of determining whether the selected semiconductor memory is currently performing the read operation, when it is determined that the selected semiconductor memory is currently performing the read operation (Yes), the memory system waits for a certain time (S970), and repeats the above-described processes from the step S930.

As a result of the step S960 of determining whether the selected semiconductor memory is currently performing the read operation, when it is determined that the selected semiconductor memory is currently performing a memory operation (e.g., a program operation or an erase operation) other than the read operation (No), the suspend determiner 1222B checks whether the selected semiconductor memory is allowed to perform a suspend operation based on the status read data SR_DATA (S980).

The suspend determiner 1222B determines that the selected semiconductor memory is allowed to perform the suspend operation when it is determined that the selected semiconductor memory is currently performing a program operation or erase operation (other than a read operation) and is performing an operation corresponding to a suspension-allowed period during the program operation or erase operation, based on the status read data SR_DATA. The suspend determiner 1222B determines that the selected semiconductor memory is not allowed to perform the suspend operation when it is determined that the selected semiconductor memory is currently performing a program operation or erase operation (other than a read operation) and is performing an operation corresponding to the suspension-prohibited period during the program operation or erase operation, based on the status read data SR_DATA.

As a result obtained by determining, by the suspend determiner 1222B, (S990), when the selected semiconductor memory 100 is not allowed to perform the suspend operation (No), the suspend determiner 1222B generates and outputs a suspend disable signal suspend_dis, and the status checker 1222A generates and outputs a status read command SR_CMD for controlling the selected semiconductor memory to perform a status read operation in response to the suspend disable signal suspend_dis. The selected semiconductor memory outputs new status read data SR_DATA to the suspend determiner 1222B in response to the status read command SR_CMD, and the suspend determiner 1222B repeats the above-described processes from the step S980 by using the new status read data SR_DATA.

As a result obtained by determining, by the suspend determiner 1222B, (S990), when the selected semiconductor memory 100 is allowed to perform the suspend operation (Yes), the suspend determiner 1222B generates and outputs a suspend enable signal suspend_en. The command generator 1222C generates and outputs a suspend command Suspend_CMD for suspending a currently ongoing memory operation of the selected semiconductor memory, in response to the suspend enable signal suspend_en generated by the suspend determiner 1222B. The suspend command Suspend_CMD may be transmitted to the selected semiconductor memory through the flash controller 1250 shown in FIG. 2 (S1000). The selected semiconductor memory suspends the operation being currently performed in response to the suspend command Suspend_CMD.

The command generator 1222C generates and outputs a read command Read_CMD such that the selected semiconductor memory performs a read operation in response to the suspend enable signal suspend_en generated by the suspend determiner 1222B, and the flash controller 1250 transmits the read command Read_CMD generated by the command generator 1222C to the selected semiconductor memory (S1010).

The selected semiconductor memory performs a read operation of reading data DATA stored in a corresponding area in response to the received read command Read_CMD and transmitting the read data DATA to the controller 1200 (S1020). The data DATA transmitted to the controller 1200 may be temporarily stored in the memory buffer 1230 and then be transmitted to the host 1400 through the host controller 1210.

When the read operation is completed, the command generator 1222C generates and outputs a resume command Resume_CMD, and the flash controller 1250 transmits the resume command Resume_CMD to the selected semiconductor memory (S1030).

The selected semiconductor memory resumes the suspended operation in response to the resume command Resume_CMD (51040).

Figure 10A:
FIGS. 10A to 10C are diagrams illustrating status read commands in a suspend operation in accordance with an embodiment of the present disclosure.
Figure 10B:
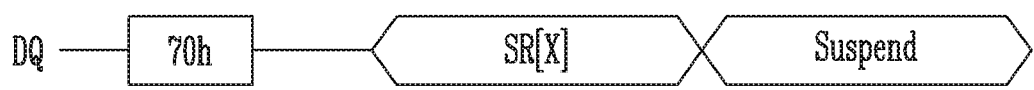
Figure 10C:
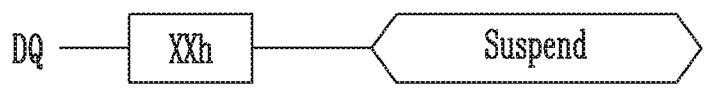

FIG. 10A to 10C are diagrams illustrating status read commands in a suspend operation in accordance with an embodiment of the present disclosure.

Referring to FIG. 10A, like a general status read command, a status read command generated by the status checker 1222A shown in FIG. 3 may include a signal 70h notifying reception of a command through a data line DQ of a semiconductor memory and a signal SR[X] representing the status read command. The status read command may be used in addition to the suspend operation.

Referring to FIG. 10B, a status read command generated by the status checker 1222A may include a signal Suspend representing the suspend operation, in addition to a signal 70h notifying reception of a command and a signal SR[X] representing the status read command as shown in FIG. 10A.

Referring to FIG. 10C, a status read command generated by the status checker 1222A may include a signal XXh notifying reception of a specific command and a signal Suspend representing the suspend operation.

Figure 11A:
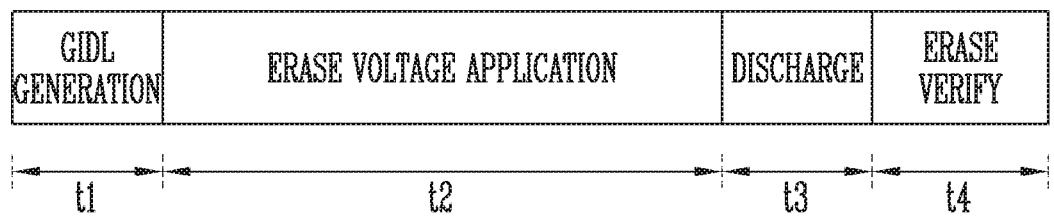
FIGS. 11A and 11B are diagrams illustrating configurations of an erase operation and a program operation.
Figure 11B:
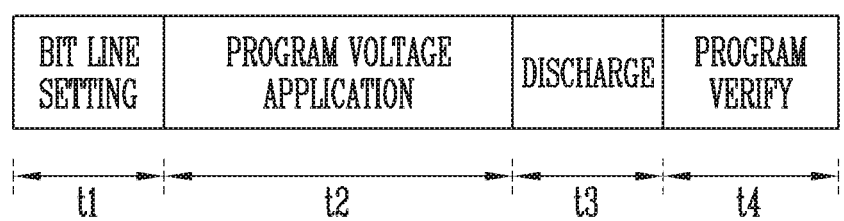

FIGS. 11A and 11B are diagrams illustrating configurations of an erase operation and a program operation.

Referring to FIG. 11A, in an erase operation of a semiconductor memory, an erase loop may be repeatedly performed at least once. The erase loop may include a GIDL generation period U, an erase voltage application period t2, a discharge period t3, an erase verify period t4, and the like. In an embodiment of the present disclosure, the GIDL generation period t1 may be set as a suspension-prohibited period, and the erase voltage application period t2, the discharge period t3, the erase verify period t4, and the like may be set as a suspension-allowed period.

Referring to FIG. 11B, in a program operation of a semiconductor memory, a program loop may be repeatedly performed at least once. The program loop may include a bit line setting period t, a program voltage application period t2, a discharge period t3, a program verify period t4, and the like. In an embodiment of the present disclosure, the program voltage application period t2 may be set as a suspension-prohibited period, and the bit line setting period t, the discharge period t3, the program verify period t4, and the like may be set as a suspension-allowed period.

The suspension-prohibited period and the suspension-allowed period in the erase operation and the program operation may be changed and set.

In accordance with the above-described embodiment of the present disclosure, a suspend operation of a semiconductor memory is performed when a host command corresponding to a read operation is received from the host. The suspend operation can be performed by avoiding a weak period in which the reliability of the semiconductor memory is deteriorated, such as the GIDL generation period of the erase operation or the program voltage application period of the program operation.

Figure 12:
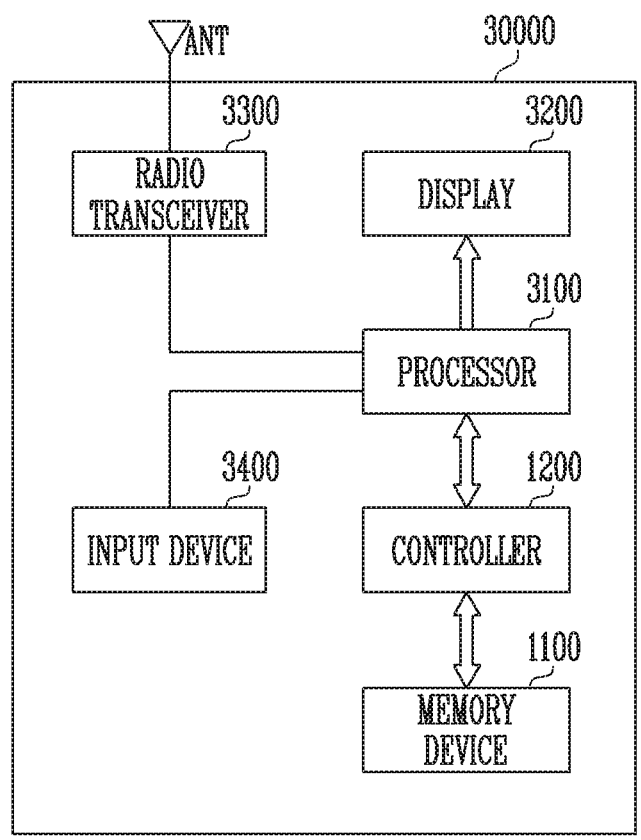
FIG. 12 is a diagram illustrating another embodiment of the memory system.

FIG. 12 is a diagram illustrating another embodiment of the memory system.

Referring to FIG. 12, the memory system 30000 may be implemented as a cellular phone, a smart phone, a tablet PC, a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mouse, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100. Also, the controller 1200 may be implemented with the controller shown in FIG. 2.

Figure 13:
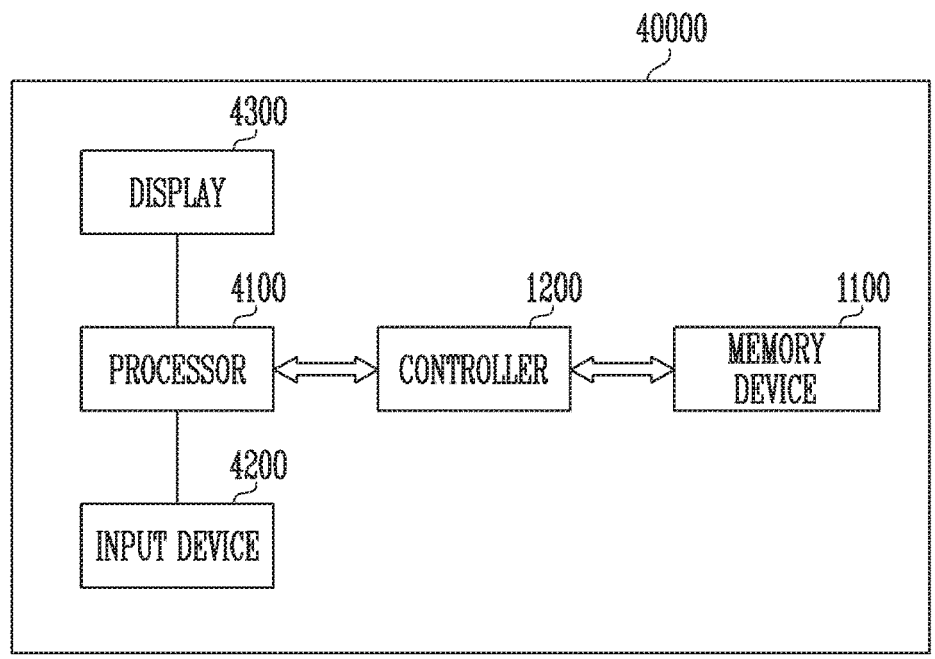
FIG. 13 is a diagram illustrating another embodiment of the memory system.

FIG. 13 is a diagram illustrating another embodiment of the memory system.

Referring to FIG. 13, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the controller 1200. In some embodiments, the controller 1200 capable of controlling an operation of the memory device 1100 may be implemented as a part of the processor 4100, or be implemented as a chip separate from the processor 4100. Also, the controller 1200 may be implemented with the controller shown in FIG. 2.

Figure 14:
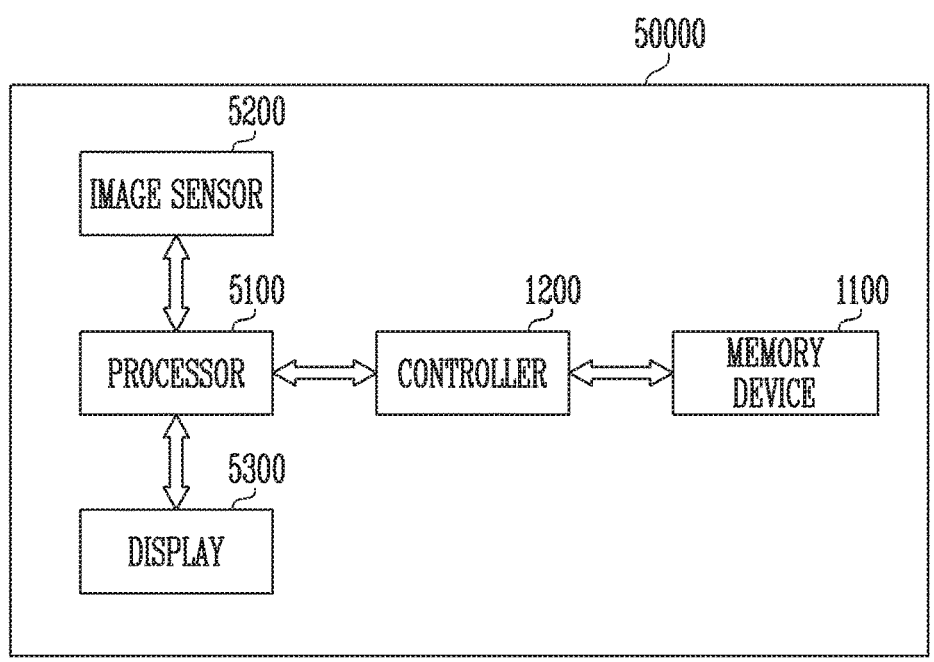
FIG. 14 is a diagram illustrating another embodiment of the memory system.

FIG. 14 is a diagram illustrating another embodiment of the memory system.

Referring to FIG. 14, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the controller 1200. Under the control of the processor 5100, the converted digital signals may be output through a display 5300, or be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as a part of the processor 5100, or be implemented as a chip separate from the processor 5100. Also, the controller 1200 may be implemented with the controller shown in FIG. 2.

Figure 15:
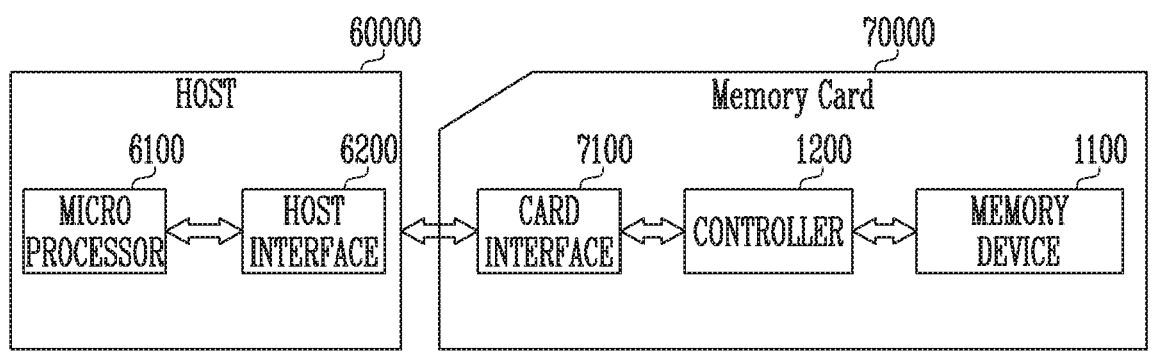
FIG. 15 is a diagram illustrating another embodiment of the memory system.

FIG. 15 is a diagram illustrating another embodiment of the memory system.

Referring to FIG. 15, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the controller 1200 may be implemented with the controller shown in FIG. 2.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor 6100.

In accordance with the present disclosure, a suspend operation in an operation period having large reliability degradation is suppressed based on status data of the semiconductor memory, so that the reliability of the memory system can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed, or parts of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory system comprising:
   a semiconductor memory configured to perform a memory operation and perform a suspend operation of suspending a currently performed memory operation; and
   a controller configured to control the memory operation,
   wherein the controller controls the semiconductor memory to perform the suspend operation in a suspension-allowed period by determining a detailed operation period of the currently performed memory operation.

2. The memory system of claim 1,
   wherein the memory operation is one of a read operation, a program operation and an erase operation,
   wherein a suspension-prohibited period is one of an entire period of the read operation, a program voltage application period of the program operation, and a Gate Induced Drain Leakage (GIDL) generation period of the erase operation.

3. The memory system of claim 1,
   wherein the semiconductor memory includes a ready/busy signal generator and a status register,
   wherein the ready/busy signal generator generates and outputs a ready/busy signal representing a ready state or busy state of the semiconductor memory, and
   wherein the status register stores information on the currently performed memory operation, and outputs, as status read data, the information on the currently performed memory operation in a status read operation.

4. The memory system of claim 3, wherein the controller includes a suspend controller configured to control, when a host command corresponding to a read operation is received from a host, the semiconductor memory to perform a read operation by determining a current state of the semiconductor memory, or to perform the suspend operation and then perform the read operation.

5. The memory system of claim 4, wherein the suspend controller includes:
   a status checker configured to generate a status read command for controlling the semiconductor memory to perform the status read operation in response to the host command;
   a suspend determiner configured to generate a suspend enable signal or a suspend disable signal in response to the ready/busy signal and the status read data; and
   a command generator configured to generate and output a suspend command for the suspend operation in response to the suspend enable signal,
   wherein the suspend controller re-generates the status read command in response to the suspend disable signal.

6. The memory system of claim 5,
   wherein the suspend determiner generates and outputs the suspend enable signal, when it is determined that the semiconductor memory is in the ready state based on the ready/busy signal, and
   wherein the command generator generates and outputs a read command corresponding to the read operation such that the semiconductor memory performs the read operation when the semiconductor memory is in the ready state.

7. The memory system of claim 6, wherein the suspend determiner determines whether the detailed operation period is a suspension-prohibited period or the suspension-allowed period based on the status read data when it is determined that the semiconductor memory is in the busy state based on the ready/busy signal.

8. The memory system of claim 7,
   wherein the suspend determiner generates and outputs the suspend enable signal when it is determined that the semiconductor memory is performing an operation corresponding to the suspension-allowed period,
   wherein the command generator generates and outputs the suspend command in response to the suspend enable signal.

9. The memory system of claim 8, wherein the command generator:
   generates the suspend command and then generates and outputs the read command; and
   generates and outputs a resume command for controlling the semiconductor memory to resume the memory operation that was being performed before the memory operation was suspended, after the semiconductor memory completes the read operation that was performed after the suspending of the memory operation.

10. A memory system comprising:
a memory device including a plurality of semiconductor memories; and
a controller configured to control a selected semiconductor memory of the plurality of semiconductor memories to perform a suspend operation of suspending a currently performed memory operation of the selected semiconductor memory and a read operation when a host command corresponding to the read operation is received from a host,
wherein the controller determines a detailed period of the currently performed memory operation, and controls the selected semiconductor memory to perform the suspend operation when the detailed period corresponds to a suspension-allowed period.

11. The memory system of claim 10, wherein the controller determines the detailed period based on a ready/busy signal and status data from the selected semiconductor memory.

12. The memory system of claim 10, wherein the controller, when the detailed period corresponds to a suspension-prohibited period, repeats an operation of determining the detailed period until the detailed period corresponds to the suspension-allowed period.

13. The memory system of claim 12, wherein the suspension-prohibited period is one of a program voltage application period during a program operation and a Gate Induced Drain Leakage (GIDL) generation period during an erase operation.

14. A method for operating a memory system, the method comprising:
generating a status read command to determine a current state of a semiconductor memory in response to a request from a host;
reading status data of the semiconductor memory in response to the status read command and outputting the status data to a controller;
determining a detailed period of a currently performed memory operation of the semiconductor memory based on a ready/busy signal and the status data of the semiconductor memory;
outputting a suspend command such that the semiconductor memory suspends the currently performed memory operation when the detailed period is a suspension-allowed period; and
suspending the currently performed memory operation in response to the suspend command.

15. The method of claim 14, further comprising:
suspending the currently performed memory operation and then performing a read operation in response to a read operation command; and
resuming the memory operation that was being performed before the memory operation was suspended in response to a resume command after the read operation that was performed after the suspending of the memory operation is completed.

16. The method of claim 15, wherein the read operation is performed in response to the read operation command when it is determined that the semiconductor memory is in a ready state based on the ready/busy signal.

17. The method of claim 15, wherein, when it is determined that the currently performed memory operation is another read operation based on the ready/busy signal and the status data of the semiconductor memory, the read operation is performed in response to the read operation command after the another read operation is completed.

18. The method of claim 14, further comprising repeating, when the detailed period is a suspension-prohibited period, the determining, the outputting and the suspending until the detailed period becomes the suspension-allowed period.

19. The method of claim 18,
wherein a program operation is the currently performed memory operation, and
wherein the suspension-prohibited period is a program voltage application period.

20. The method of claim 18,
wherein an erase operation is the currently preformed memory operation, and
wherein the suspension-prohibited period is a Gate Induced Drain Leakage (GIDL) generation period.

* * * * *